United States Patent [19]

Dingwall

[11] Patent Number: 5,739,805
[45] Date of Patent: Apr. 14, 1998

[54] MATRIX ADDRESSED LCD DISPLAY HAVING LCD AGE INDICATION, AND AUTOCALIBRATED AMPLIFICATION DRIVER, AND A CASCADED COLUMN DRIVER WITH CAPACITOR-DAC OPERATING ON SPLIT GROUPS OF DATA BITS

[75] Inventor: Andrew Gordon Francis Dingwall, Princeton, N.J.

[73] Assignee: David Sarnoff Research Center, Inc., Princeton, N.J.

[21] Appl. No.: 356,937

[22] Filed: Dec. 15, 1994

[51] Int. Cl.$^6$ ............................................. G09G 3/36
[52] U.S. Cl. ............................................. 345/100; 345/87
[58] Field of Search ............................. 345/100, 101, 345/87, 89, 77, 94–96, 98; 348/674, 751; 341/50; 327/65; 359/86, 99; 349/37

[56] References Cited

U.S. PATENT DOCUMENTS

| | | | |
|---|---|---|---|
| 4,476,456 | 10/1984 | Domogalla | 341/118 |
| 4,739,396 | 4/1988 | Hyatt | 348/751 |
| 4,746,915 | 5/1988 | Sekiya | 345/205 |
| 4,801,933 | 1/1989 | Yamamoto | 345/88 |
| 4,868,668 | 9/1989 | Tavernetti | 348/745 |
| 4,923,285 | 5/1990 | Ogino et al. | 345/101 |
| 4,963,860 | 10/1990 | Stewart | 345/206 |
| 4,968,989 | 11/1990 | Olmstead | 341/150 |
| 4,999,633 | 3/1991 | Draxelmayr | 341/120 |
| 5,016,012 | 5/1991 | Scott | 341/118 |
| 5,041,821 | 8/1991 | Onitsuka et al. | 345/101 |
| 5,053,770 | 10/1991 | Mayer | 341/118 |
| 5,088,806 | 2/1992 | McCartney et al. | 345/101 |
| 5,089,811 | 2/1992 | Leach | 345/199 |
| 5,103,218 | 4/1992 | Takeda | 345/100 |
| 5,111,319 | 5/1992 | Morris | 345/210 |
| 5,124,688 | 6/1992 | Rumball | 345/154 |
| 5,162,786 | 11/1992 | Fukuda | 345/100 |
| 5,162,801 | 11/1992 | Powell et al. | 341/50 |
| 5,184,118 | 2/1993 | Yamazaki | 345/96 |
| 5,192,945 | 3/1993 | Kushada | 345/100 |
| 5,196,738 | 3/1993 | Takahara | 345/89 |
| 5,196,924 | 3/1993 | Lumelsky et al. | 348/674 |
| 5,266,936 | 11/1993 | Saitoh | 345/98 |
| 5,300,944 | 4/1994 | Shapiro | 345/88 |
| 5,352,937 | 10/1994 | Dingwall | 327/65 |
| 5,434,599 | 7/1995 | Hirai et al. | 345/100 |

*Primary Examiner*—Mark R. Powell
*Assistant Examiner*—Martin Loui

[57] ABSTRACT

A column driver for a matrix addressed display such as a liquid crystal display (LCD) is disclosed. The column driver accepts 10-bit inputs, provides 1024 distinct output levels, and is compatible with digital gamma correction by way of, for example, an EPROM lookup table. A complete column driver includes a group of chips which are serially interconnected and receive all the external signals applied in parallel. Only one chip is made active at any instant of time, in order to save power. In each IC, selective polarity inversion of the 10-bit data is carried out before feeding it to a switched capacitor digital to analog converter (CAPDAC) which operates in either a high or low voltage range. All CAPDACs are loaded simultaneously and present a precise output for approximately 95% of each linetime. Each CAPDAC output is connected to a buffer opamp via two CMOS switches which cause the CAPDAC to simultaneously yet transparently change range and allow the opamp buffer to continue driving. The buffer accepts a high impedance, low parasitic input voltage from the CAPDAC array and outputs a low input signal for driving columns with 150–400 pF capacitance. The buffer has an autocalibration circuit that comprises a nested, mini-operational amplifier (opamp) coupled between the output and input of the buffer. The mini-opamp amplifies the balance error produced by the buffer during a calibration interval to provide an output signal which changes the balance point of the buffer amplifier.

18 Claims, 11 Drawing Sheets

LAYOUT OF 128 COLUMN DRIVER IC

MATRIX ADDRESSED LCD DISPLAY HAVING LCD AGE INDICATION, AND AUTOCALIBRATED AMPLIFICATION DRIVER, AND A CASCADED COLUMN DRIVER WITH CAPACITOR-DAC OPERATING ON SPLIT GROUPS OF DATA BITS

This invention was made with Government support under Contract No. F33615-92-C-3804 awarded by the U.S. Department of the Air Force. The Government has certain rights in this invention.

FIELD OF THE INVENTION

The invention generally relates to a matrix addressed display and, more particularly, it relates to a column driver for such an display.

BACKGROUND OF THE INVENTION

A matrix addressed display is organized to have a plurality of rows and columns for addressing and supplying data to the display elements. For example, liquid crystal displays (LCDs) typically comprise many rows (e.g., greater than 600) and normally even more columns (e.g., greater than 900) of liquid crystal light valves. For color displays, "color pixel clusters" are sometimes used where each cluster can comprise as many as 3 or 4 subpixels (1 or 2 RED, 1 BLUE and 1 GREEN).

In an LCD the brightness of each pixel is electrically controllable as a function of a column voltage supplied to each individual top pixel plate and a common backplane electrode. Such column voltages are typically generated in parallel by many (e.g. 8–24) column driver integrated circuits (ICs). Along with the application of column voltages, row scanning is accomplished by shift registers situated at one or both ends of the display. A bit is shifted through the register to activate each row. The column pixels for that row are then activated by the column drivers.

Presently, column drivers for available displays have 3-bit to 6-bit capability which, respectively, provides for 8 and 64 gray brightness levels. The brightness levels are designated by steps having individual heights within the available voltage range. Voltage step heights generally have to be non-uniformly spaced to achieve uniform brightness steps (as judged by the human eye). As expected, lower numbers of gray levels result in a lower quality image. This nonlinearity is achieved through a process known as gamma correction.

Present commercial column driver ICs capable of handling 128 to 192 columns have many significant drawbacks. First, they are specified to have column matching inaccuracies on the order of 25 mv to 100 mv on an integrated circuit (IC) where studies have shown that the human eye can detect column brightness striations in an LCD as low as 8 mv.

In operation, the column drivers provide voltage values which charge an individual line of a display during a line time. Each line in the display is successively selected to receive pixel data values from the column drivers until an entire picture has been formed. Individual lines are selected using, for example, a walking-one shift register coupled to row select circuitry (not shown) of a display (not shown).

One display system is shown in U.S. Pat. No. 5,162,786 to Fukuda entitled DRIVING CIRCUIT OF A LIQUID CRYSTAL DISPLAY. The column driver circuit described in this patent includes a digital to analog converter on each column which charges a pixel capacitance using an analog signal generated by a two-stage DAC. The first stage selects a pair of adjacent reference voltages from a set of 16 reference voltages. This pair of reference voltages is applied to the second stage which employs pulse-width modulation produce a signal which, when integrated, represents an eight-bit value. In order to ensure that the pixel capacitor is adequately charged, this circuit performs the D/A conversion operation 10 times during the line interval. These ten cycles are performed in 1.6 µs. Assuming a line time of 16 µs, the capacitance is being driven only 10 percent of the line time.

This low percentage drive time is undesirable if the display device is to be used in an environment containing significant levels of RF noise. This noise tends to redistribute charge on the array, causing the image pixels to blur.

Power considerations may be one reason that the drive time for this circuit is so low. If the circuit were to drive the pixel during a larger portion of the line time, it may draw too much power, causing heat problems in the display device. Alternatively, it may be that the low drive-time is due to the pulse-width modulation, integration of this type of signal over more than the ten cycles specified may degrade the accuracy of the digital to analog conversion.

Another disadvantage of prior art LCD display devices is the retention of charge on the LCD elements from image to image. Some existing devices compensate for this retention by switching the voltage ranges used to switch the liquid crystal from a range that is greater than the reference potential that is applied to the LCD back-plane to a range that is less than the reference potential. Because this switching of voltage ranges produces different gray scales, it may be distracting if the image is switched on a frame-by-frame basis.

SUMMARY OF THE INVENTION

The invention is embodied in a column driver circuit which produces drive signals for a plurality of columns of a display to display lines of picture elements during respective line intervals. The column driver circuit includes a register which holds digital values corresponding to a respective plurality of picture elements (a portion of a line) in the display. It also includes a switched-capacitor digital-to-analog converter (CAPDAC), coupled to respective ones of the plurality of storage cells, which generates analog signal levels representing the digital values, respectively. The column driver circuit also includes an operational amplifier, responsive to the analog signal levels, which produces signals to drive the respective plurality of columns of the display during an interval greater than one-half of the line time.

According to another aspect of the invention, the switching of voltage ranges in the array may be accomplished on a column by column basis, allowing accumulated charge on the display to be dissipated while keeping the overall contrast of the display constant.

BRIEF DESCRIPTION OF THE DRAWINGS

The aspects, features and advantages of the invention will be more readily understood from the following detailed description when read in conjunction with the accompanying drawings, in which.

3

Figure 1:
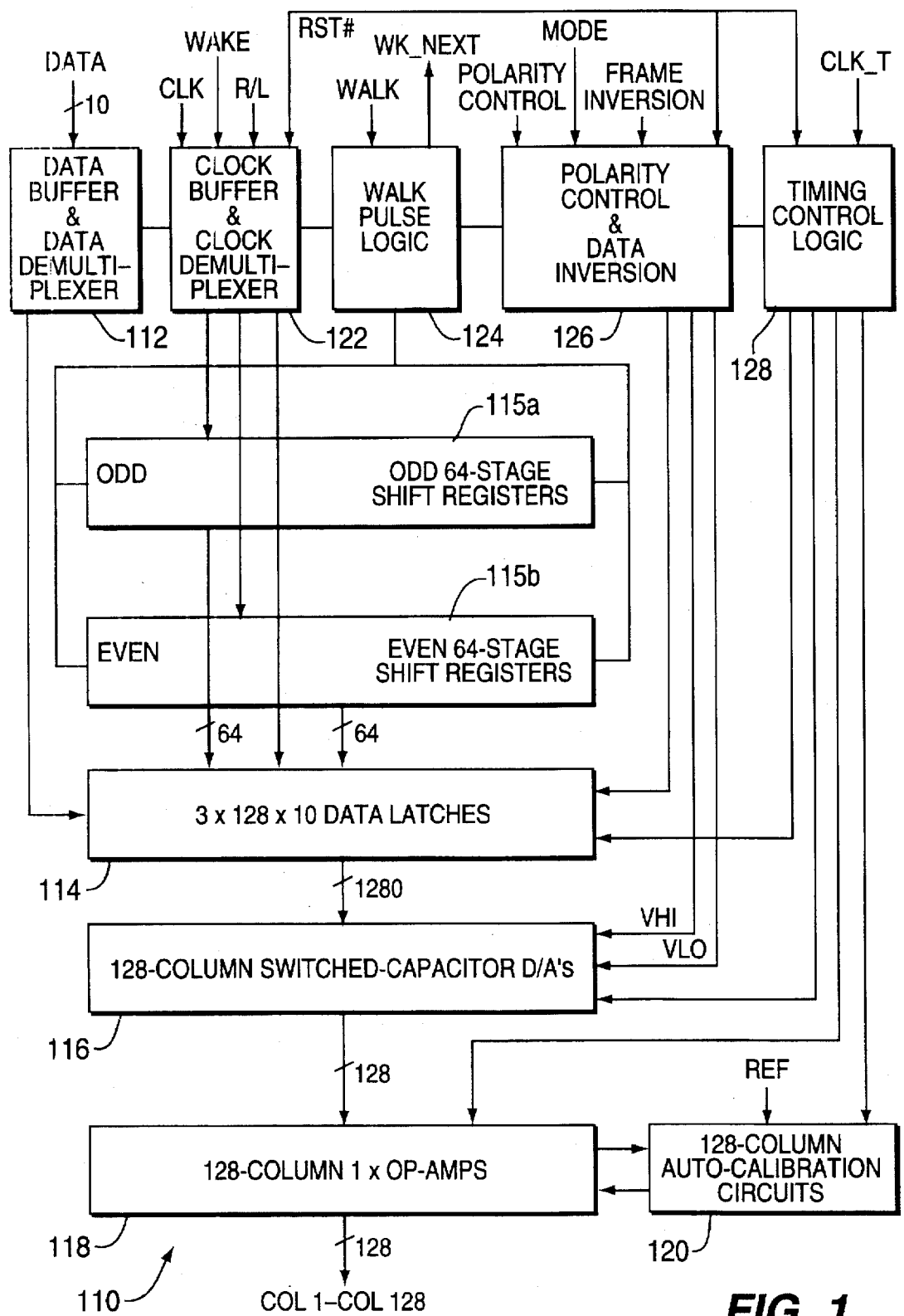
FIG. 1 shows an exemplary embodiment of a high-level functional block diagram of the column driver of the invention.
Figure 2:
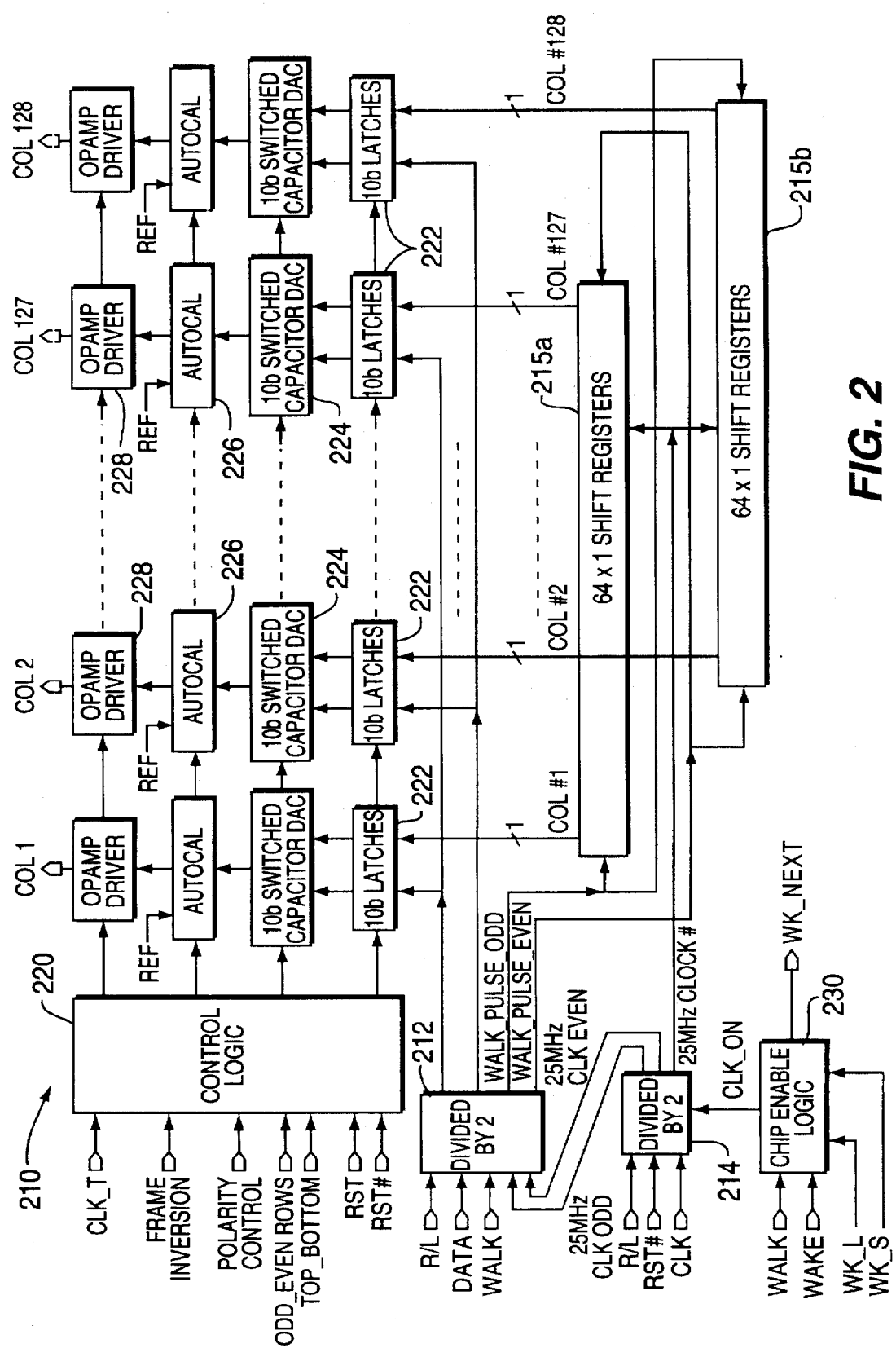

FIG. 2 shows another functional block diagram of the column driver of FIG. 1.

Figure 3:
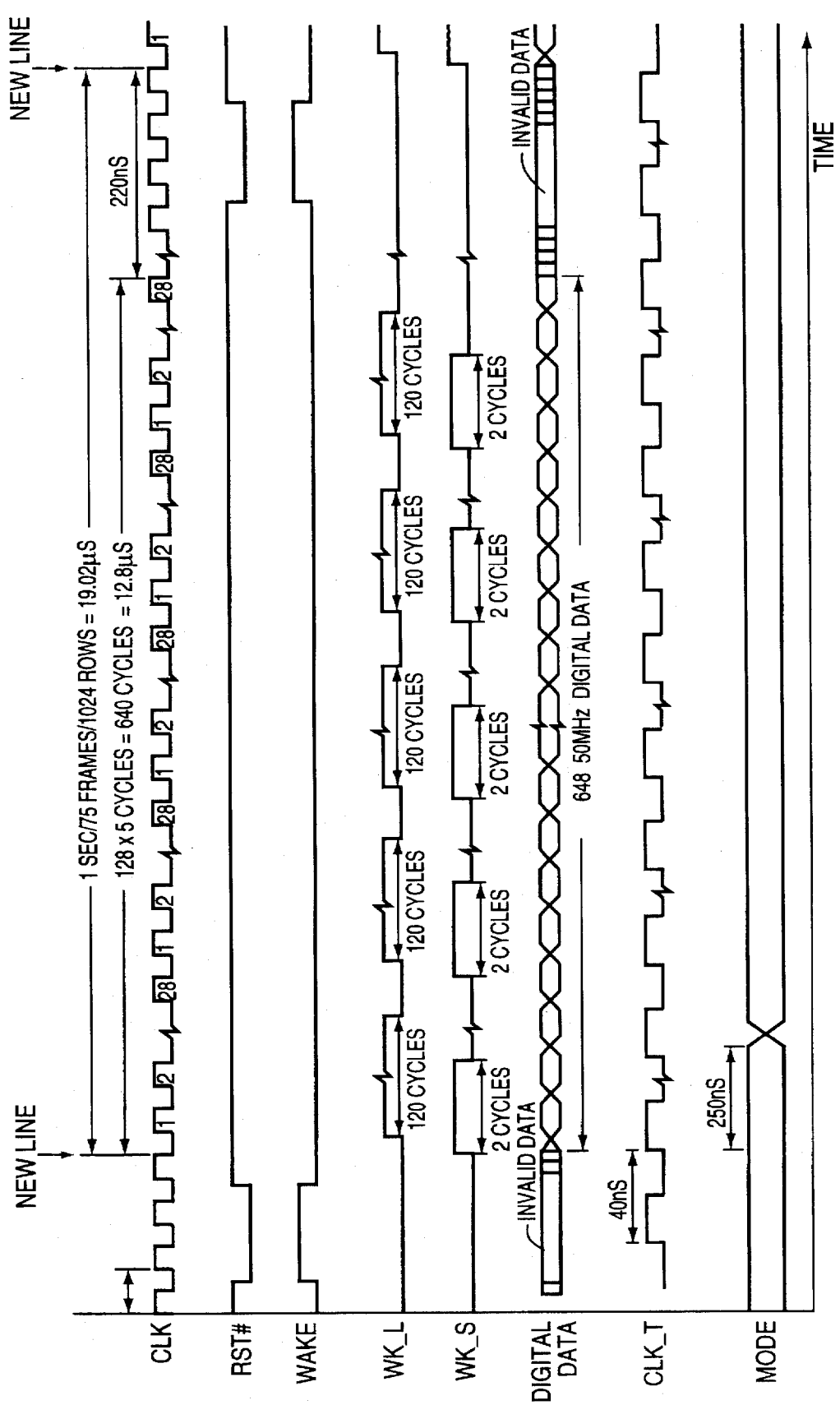

FIG. 3 shows a timing diagram of externally-provided signals to the driver of FIG. 2.

Figure 4:
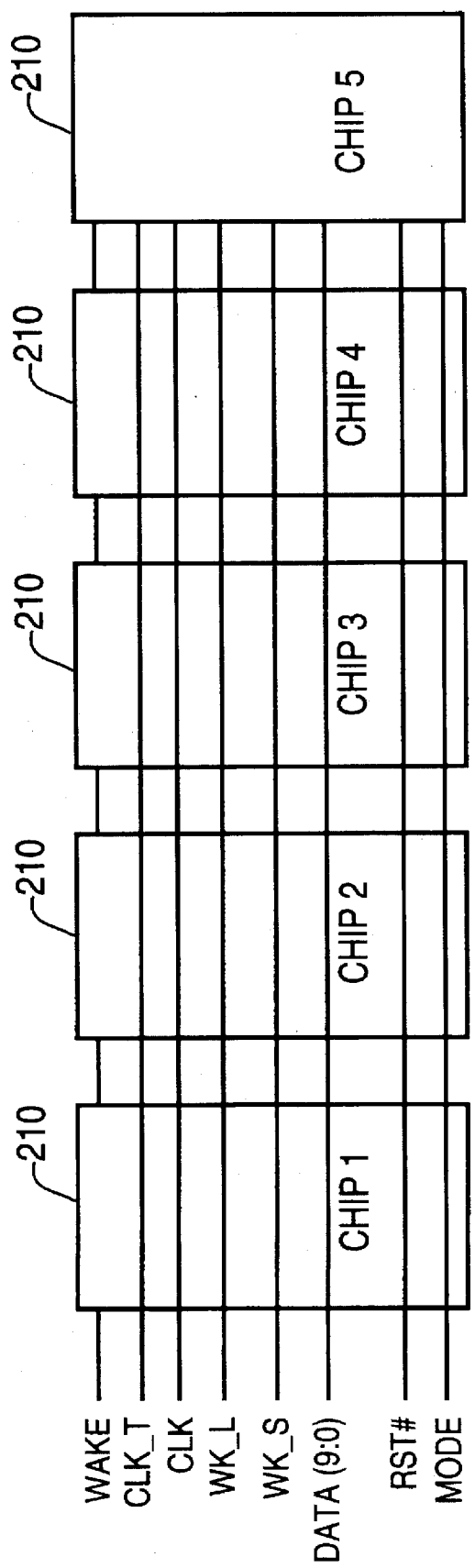

FIG. 4 shows a group of integrated circuits each containing the driver shown in FIG. 2 serially interconnected for purposes of driving 600+ columns of an LCD.

Figure 5A:
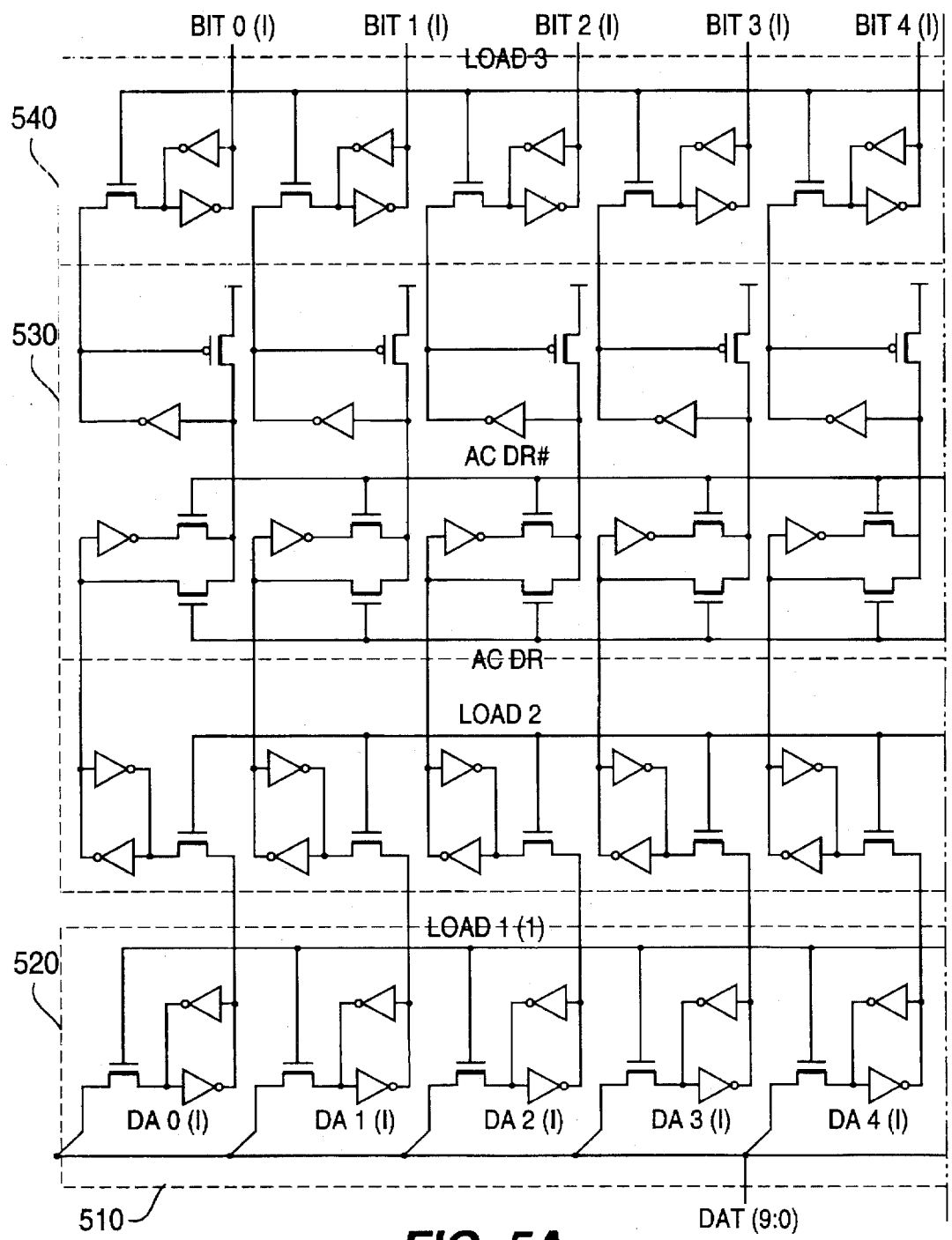
Figure 5B:
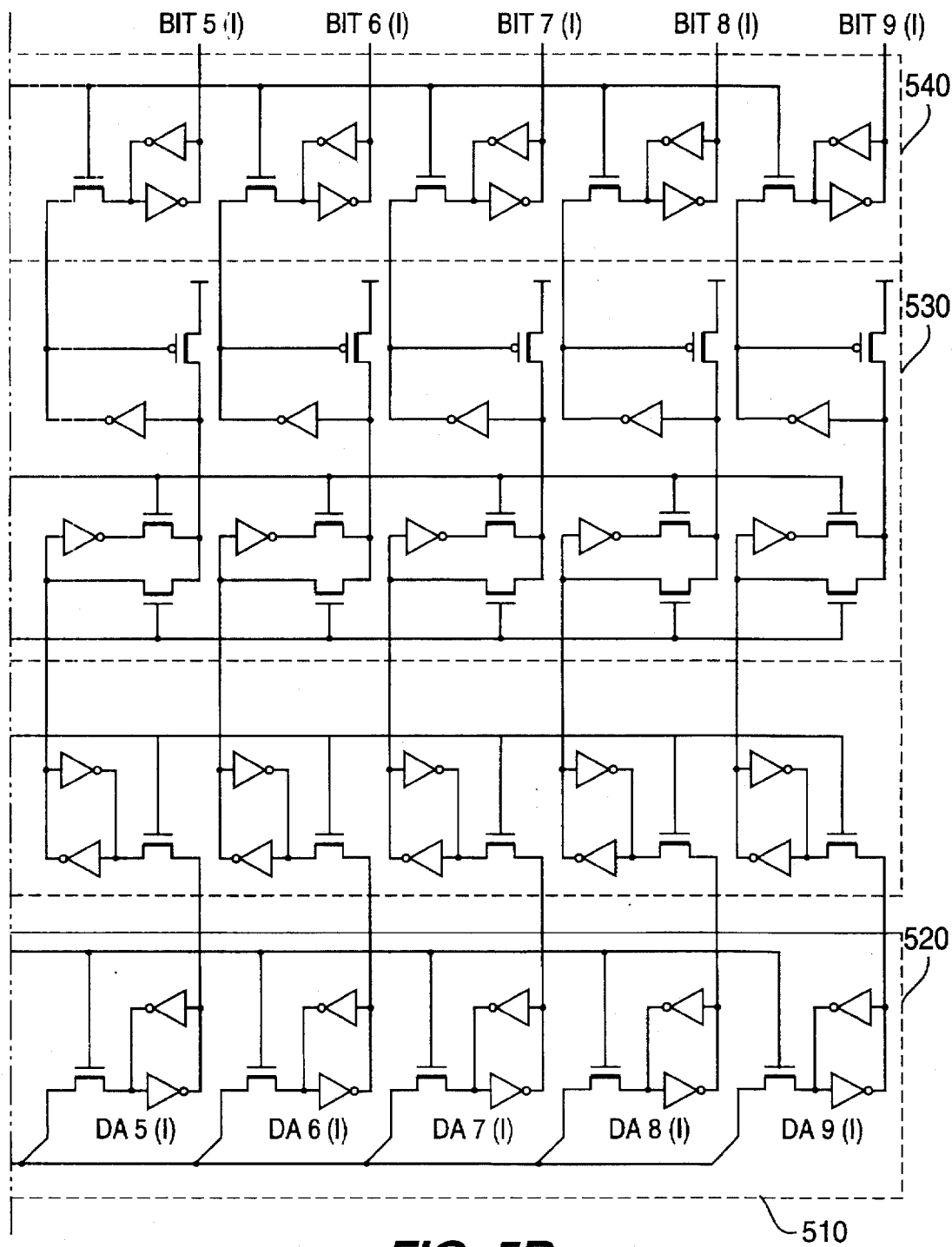

FIG. 5 shows additional detail of the 10-bit latches shown as part of the driver of FIG. 2.

Figure 6:
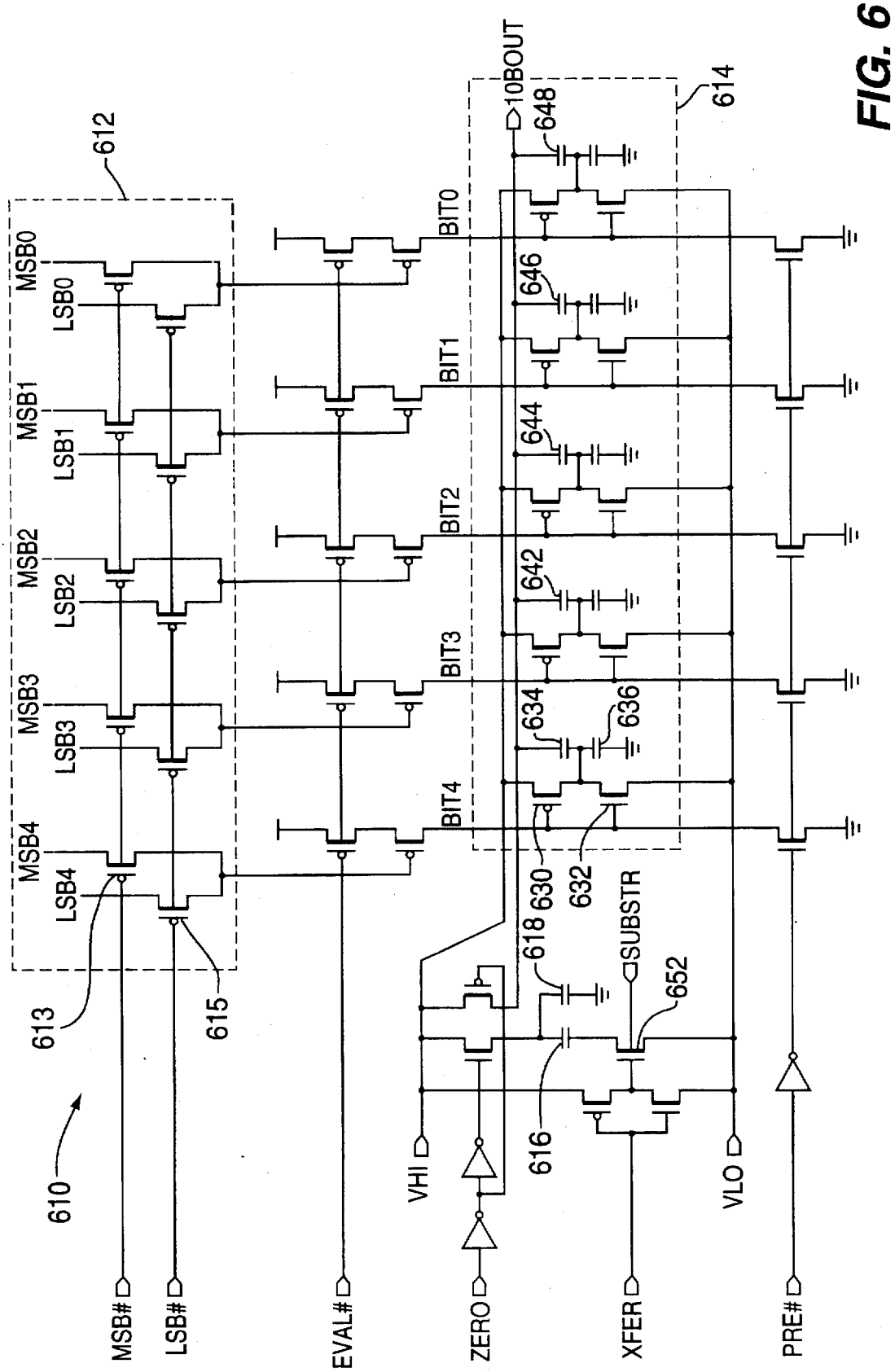

FIG. 6 shows additional detail of the CAPDAC shown as part of the driver of FIG. 2.

Figures 7, 7A:
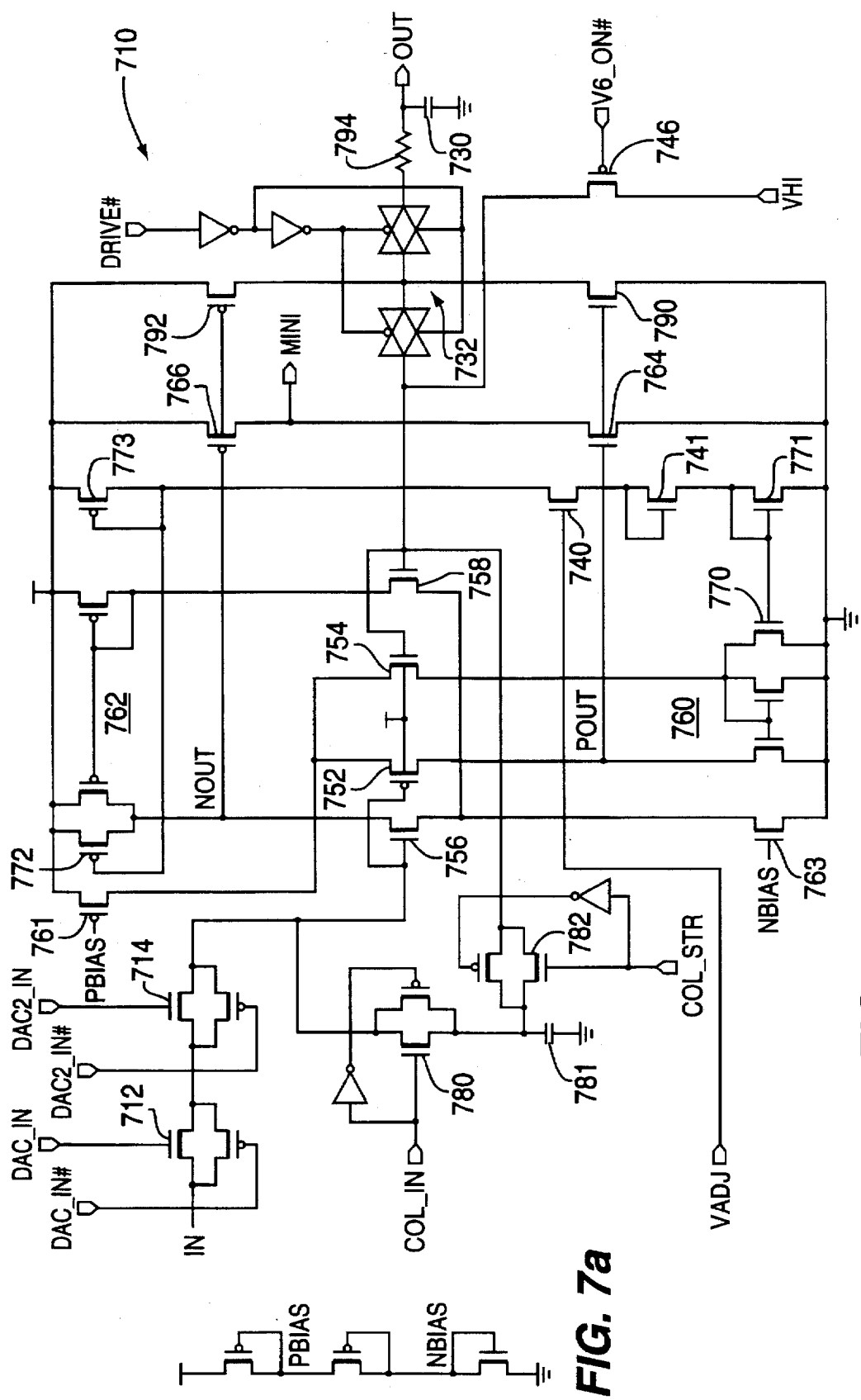

FIGS. 7 and 7a show shows additional detail of the operational amplifier shown as part of the driver of FIG. 2.

Figures 8, 8A:
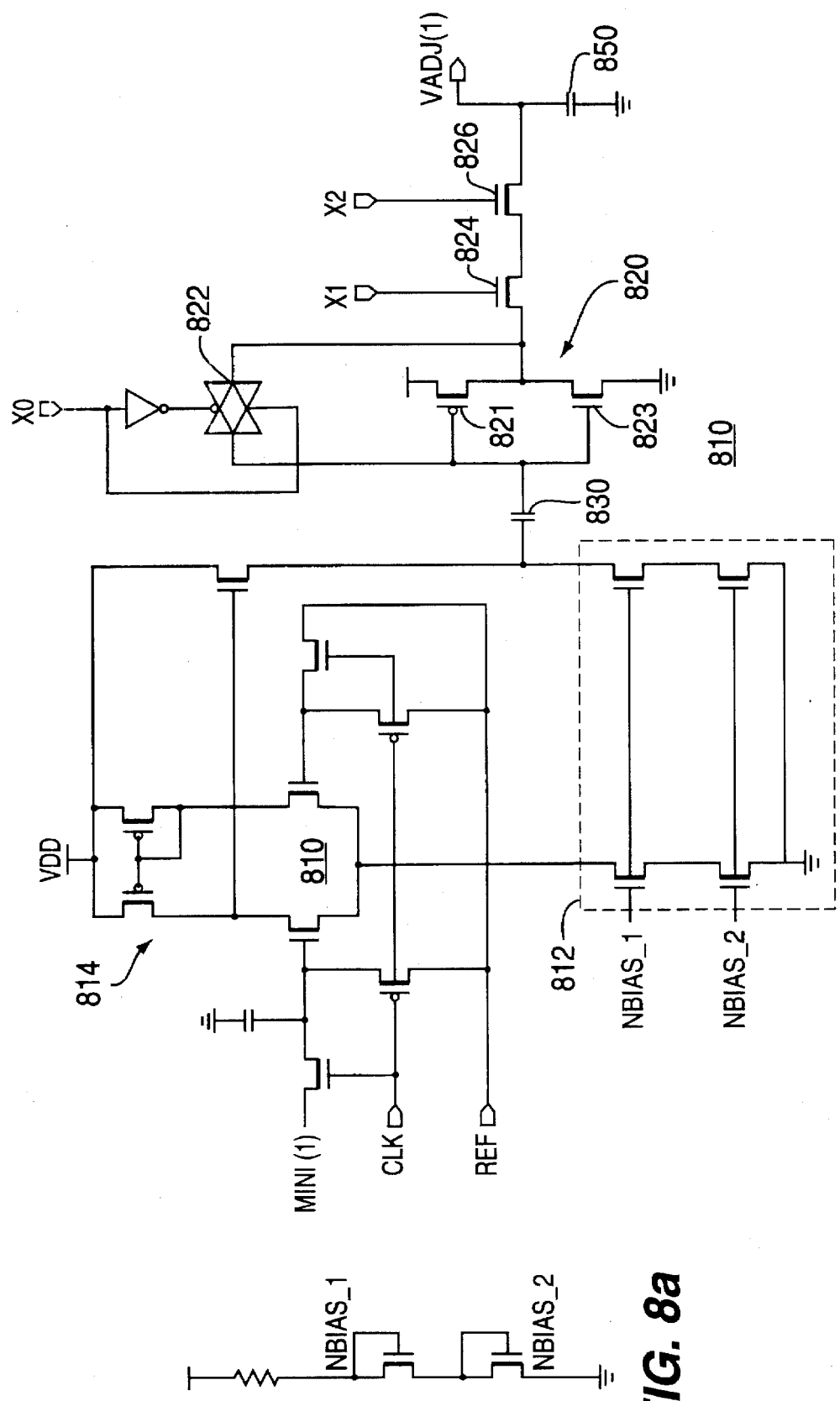

FIGS. 8 and 8a show additional detail of the autobalance circuit shown as part of the driver of FIG. 2.

Figure 9:
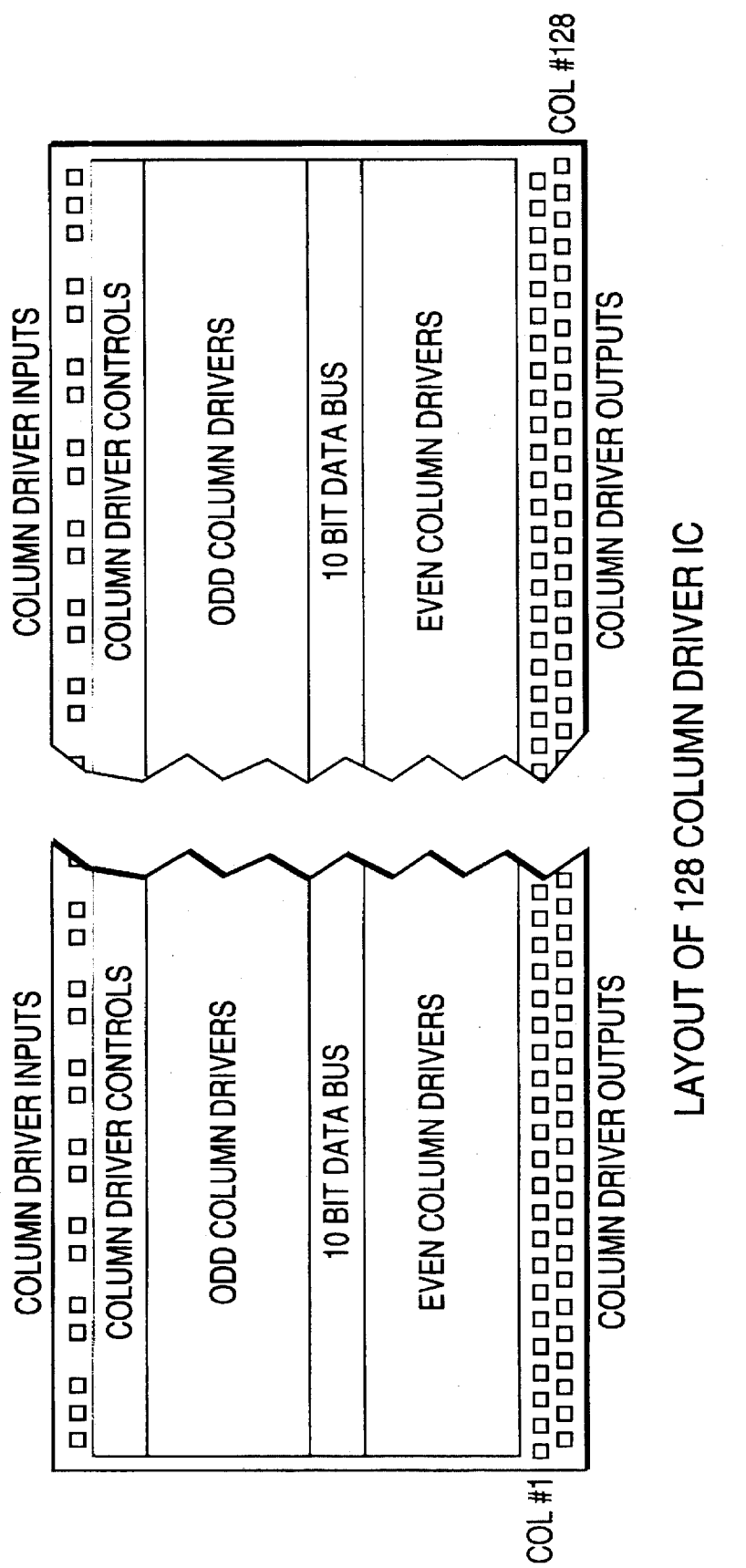

FIG. 9 shows an exemplary layout for the driver shown in FIG. 2.

Figure 10:
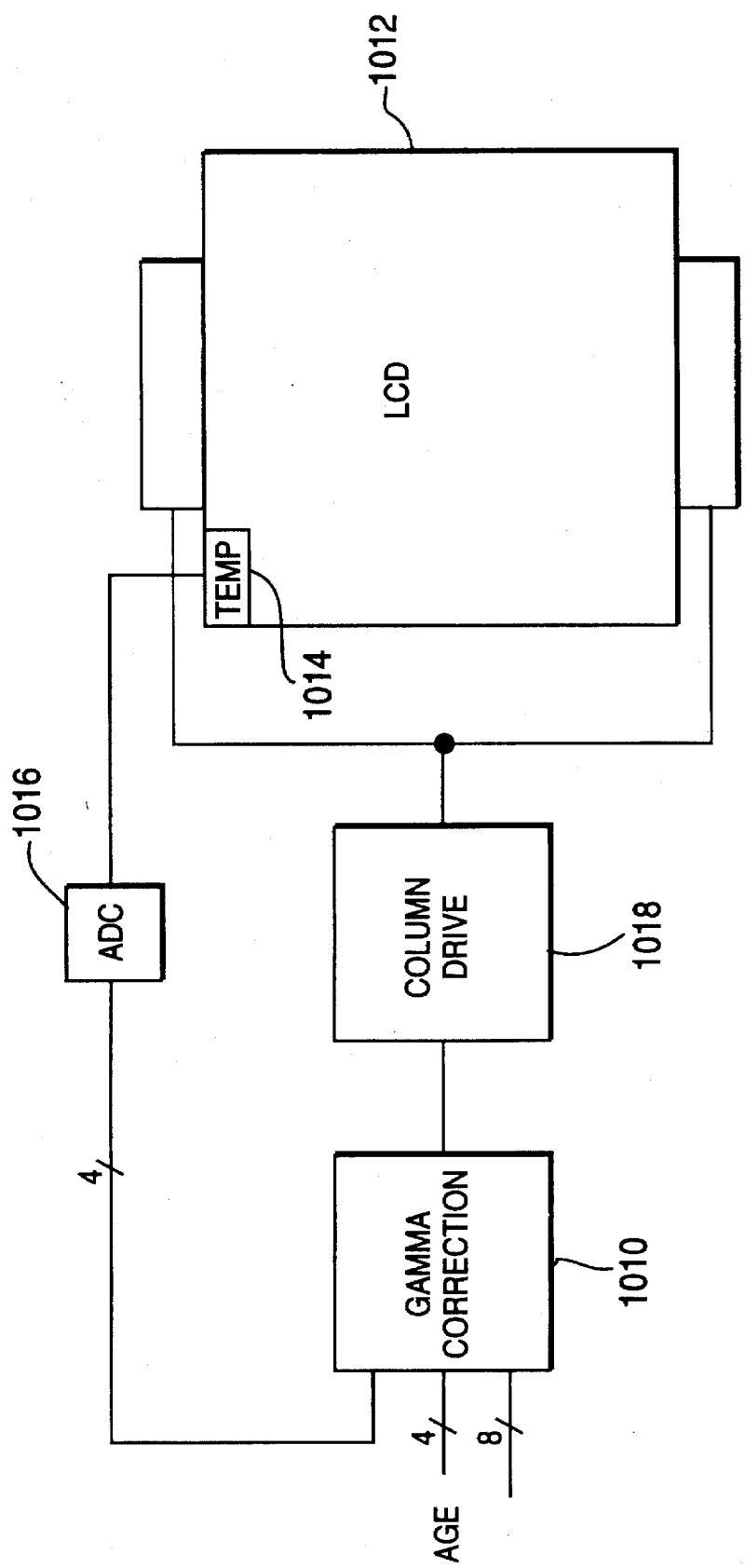

FIG. 10 shows an exemplary functional diagram of a display with the column driver inputs being digitally gamma corrected as a function of age and temperature.

DETAILED DESCRIPTION

Overview

FIG. 1 shows an exemplary high-level functional block diagram of the column driver 110 of the invention. Data and control signals such as CLK, WAKE and MODE as well as reference signals (e.g., 1.5 V, 6 V, 9 V and 13.5 V (not shown) input to polarity control logic 126) are provided from external sources. The externally supplied digital data, using externally provided and internally generated control signals, is received by a data buffer/demultiplexer 112 and processed by three tiers of latches 114. Odd and even shift registers 115a and 115b provide the timing for latching the digital data into the latches. The internally generated control signals are initiated and provided by control functions such as a clock buffer 122, a walk pulse logic circuit 124, a polarity control circuit 126 and a timing control circuit 128.

After being processed, the data, still in digital form, is delivered to CAPDACs 116. Once the digital data is converted to corresponding analog voltages, it is supplied to operational amplifiers 118, which operate in conjunction with autocalibration circuitry 120, to drive the columns of the display (shown in FIG. 10). The CAPDAC 116, operational amplifier 118 and autocalibration circuitry 120 are specially designed to provide unique features not available in conventional column drivers.

The unique design of the column driver 110, shown in FIG. 1, provides many advantages not available with current, widely used "analog input" counterparts. Generally, the digital design of the invention provides better resolution (e.g., 10 bits and 1024 distinct gray levels), higher bandwidth, compatibility with digital gamma correction, reduced number of external inputs, and higher picture quality.

In particular, the use of a digital design means the bandwidth is significantly higher since raw digital data can be rapidly captured with high accuracy. This is in comparison to analog data which must be allowed to settle and cannot be captured with both high speed and high accuracy. Moreover, significantly more external circuitry is required in slower analog designs, since the limited bandwidth of these designs requires many parallel input streams to achieve both speed and accuracy. Finally, analog input signals, which attempt to drive hundreds of columns, are pattern sensitive unlike a digital design and have diminished accuracy.

4

Furthermore, the exemplary embodiment of the invention also provides an estimated 4 mv quantization resolution (compared to the earlier mentioned conventional 25–100 mv resolution of conventional drivers) and an autocalibration feature which further contribute to the superiority of the invention over conventional column drivers.

DETAILED DESCRIPTION OF EXEMPLARY EMBODIMENT

Although functionally illustrating the same column driver shown in FIG. 1, FIG. 2 shows a slightly different functional block diagram of the column driver, now labeled 210.

As shown, the exemplary embodiment of driver 210 includes two "divide-by-2" circuits 212 and 214, two 64×1 shift registers 215a (for odd bits) and 215b (for even bits), control circuit 220 and chip enable circuit 230. Additionally, driver 210 includes, for each of the 128 columns, 10-bit latches 222 (described in detail with reference to FIG. 5), a 10-bit switched-capacitor digital-to-analog converter (CAPDAC) 224 (described in detail with reference to FIG. 6), an autobalance circuit 226 (described in detail with reference to FIG. 8) and an operational amplifier (OPAMP) driver 228 (described in detail with reference to FIG. 7).

In operation, digital data is externally provided to driver 210 at a predetermined clock rate which, in the exemplary embodiment, is 10-bits at 50 MHz. Divide-by-two circuit 212 divides the 10-bit 50 MHz data stream into two 10-bit data streams (i.e., odd and even) at one-half the clock rate (25 MHz). In addition to the 10-bit data input, externally supplied control signals are also provided. Some of these control signals are described below with reference to the timing diagrams of FIG. 3.

Referring back to FIG. 2, a 50 MHz 1-bit "walking-one" pulse is also divided into two (25 MHz) walking-one sequences by divide-by-two circuit 212 in synchronization with the data word streams. The walking-one, time sequential pulses stored in shift registers 215a and 215b are used to successively latch each 10-bit odd and even data word into a respective latch circuit—actually, in the exemplary embodiment, the first of three (3) 10-bit latches 222. It should be noted that an external signal is supplied to control whether the walking-one sequences are shifted into the shift registers 215a and 215b from the left or from the right. This allows the circuits shown in FIG. 2 to be used either at the top or the bottom of the display.

It should also be noted that all three latches for each column are included in the respective 10-bit latches functional block 222. Additional details of the 10-bit latches are described below with reference to FIG. 5.

Continuing with FIG. 2, the output signals of latches 222 are applied to respective 10-bit switched-capacitor, digital-to-analog converters (CAPDACs) 224 for conversion into appropriate analog voltage levels. An exemplary circuit, suitable for use as the CAPDAC 224 is described below with reference to FIG. 6.

The analog voltage output signals of CAPDAC 224 are then appropriately driven by OPAMP drivers 228, which include autocalibration circuitry 226, to the columns of a display. An exemplary OPAMP 228 and autobalancing circuitry 226 are described below in detail with reference to FIGS. 7 and 8, respectively.

FIG. 3 shows an exemplary timing diagram for some of the externally supplied control signals, including RST# (note that, within this specification, the symbol "#" indicates the inverse of the particular signal, e.g., RST), CLK, WAKE, WK_L and WK_S, supplied to driver 210 which affect many of the timing and control sequences/signals. The operation of a column driver circuit for a display in response to these timing signals is described below.

It is normal practice that column drivers be mounted on both the top and bottom of an LCD display. Generally, the top driver ICs drive only odd number columns and the bottom driver ICs drive only even number columns. The bottom driver ICs are rotated 180° so that the driver outputs also face the columns. An externally supplied control signal, "R/L", allows shifting of data from either "left-to-right" (for top ICs) or "right-to-left" (for bottom ICs). This permits a single IC type to be used for both "top" and "bottom" configurations.

It should be noted, however, that the driver 210 of FIG. 2 is designed to be on one integrated circuit (IC). Therefore, to drive the many hundreds of columns of a typical LCD display, a plurality of drivers 210 are needed. Therefore, the timing diagram of FIG. 3 actually illustrates the timing of control signals for a group of cascade-connected drivers 210 as illustrated in FIG. 4. In fact, the timing diagram of FIG. 3 assumes 5 cascade-connected driver ICs (see FIG. 4), a 50 MHz CLK, 75 frames/s and 1024 rows.

FIG. 4 shows how a group of individual drivers 210 can be cascade-connected (e.g., 5 separate chips) and activated by a 50 MHz clock to provide for all columns needing to be driven. In the exemplary embodiment of the invention, the group of 5 chips can accept 640, 10-bit words every 13.02ls line time.

In the exemplary embodiment of the invention, external signals are not processed by the individual chips unless a particular driver is in a "WAKEUP" state. For example, CHIP1 is the first chip to be activated by an external WAKE signal (see FIG. 3) at the start of each line, while CHIP2 through CHIP5 remain inactive. In addition to processing data, each chip also tracks or keeps a count of the data being processed responsive to the signals WK_L and CLK. Accordingly, for CHIP1, at a count of 120 (out of 128 counts), CHIP1 generates and outputs a WAKE_NEXT pulse which is applied to the WAKE input terminal of CHIP2 for purposes of internal circuit activation. By the start of count 129, CHIP2 is fully active and CHIP1 is shut down, at least until an external reset (RST#) restarts the cycle. This process of counting, generating a WAKE_NEXT pulse and shutting down is repeated for each of the first four chips. Since only 1 of the 5 chips is "essentially active" at any given time, there are significant power savings while keeping the temperature of each chip low.

FIG. 5 shows a circuit schematic suitable for use as the three-tiered 10-bit latch used for each column in the 10-bit latches functional block 222. As shown, a first 10-bit latch 510, which receives DAT(9:0), stores the received data responsive to the LOAD1 signal. Each of the individual storage elements in first 10-bit latch 510 includes a switch, responsive to a LOAD1 signal which is coupled to the gate electrode of the switch, for allowing data to pass to a cross-coupled inverter for storage. In the exemplary embodiment of the invention, all three 10-bit latches 510, 520 and 540 have a similar construction.

After capturing the data, the first latch 510 transfers all 128×10-bits into a second "invertible latch" 520 shortly after all "standard 128 counts" are completed. This transfer into the second latch 520 is responsive to the LOAD2 signal.

While the data is held in the second latch 520, a logical inversion can be performed on the data responsive to the signals AC_DR and AC_DR# (inverse of the AC_DR signal) by the circuitry 530. When the digital signal from the latches 530 is inverted, the output value is the ones complement of the input value. This selective logical inversion is employed to produce a correct light output (light or dark) at two different voltage ranges. As described above, these voltage ranges are used to cancel liquid crystal polarization effects. The two ranges are a HIGH voltage range which is from 9 v to 13.5 v while a LOW voltage range operates from 1.5 v to 6 v. When the display element to be driven by the latched data is operating in the HIGH voltage range, one logic polarity produces a dark cell for higher data values and a light cell for lower data values. In the low voltage range, this is reversed and the cell is dark for low data values and light for high data values. Accordingly, depending on which range is being used, a polarity inversion of the digital values may be needed.

The third latch 540, also part of the 10-bit latches functional block 222 of FIG. 2, accepts the appropriate polarity 128×10-bit digital levels from the second latch, stores them responsive to the LOAD3 signal, and provides them to the inputs of 10-bit switched-capacitor, DAC 224. The switched-capacitor, DAC 224 is described in detail below with reference to FIG. 6.

FIG. 6 shows a circuit schematic of an exemplary design for each 10-bit switched-capacitor, DAC 224 shown in FIG. 2 (also referred to as CAPDAC 224). Generally, the circuitry of CAPDAC 610 accepts digital inputs (MSB0-4, LSB0-4) and provides a high precision analog output (10BOUT) as a result of charge redistribution using a capacitor array.

CAPDAC 610 first evaluates the 5 least significant bits (LSB0-LSB4) and then it evaluates the 5 most significant bits (MSB0-MSB4). This results in full 10-bit accuracy for each of the 10-bit levels. Thus, each of the 10 bits is significant. It should be noted that these evaluations are done during a cycle where the desired voltage level is being actively driven approximately 95% of the time.

In particular, FIG. 6 shows a multiplexer circuit 612 which passes either the 5 LSBs or the 5 MSBs of the 10-bit word based on the input signals MSB# and LSB# coupled to the gate electrodes of the switches (e.g., transistors 613 and 615). Depending on which group of bits is passed, the 5 passed bits of digital data affect the on/off states of pairs of transistors (e.g., 630 and 632) which couple respective capacitors (e.g., 634) either to the high reference potential, VHI or to the low reference potential, VLO. The capacitor 636 represents a parasitic capacitance in the actual circuit.

It is the on or off state of the switching transistors, for example the transistors 630 and 632, which determines the amount of charge that each capacitor, for example capacitor 634, in the capacitor array contributes to the analog representation of the 10-bit digital input data. For the pairs of transistors, such as 630 and 632, the lower transistor 632 is turned on and the upper transistor 630 is turned off when a logic-high (positive) potential exists for the corresponding digital value. In this state, the reference potential VLO is applied to the lower terminal of the capacitor. When a logic-low (e.g. ground) potential exists for the corresponding digital value, these states are reversed and the reference potential VHI is applied to the lower terminal of the capacitor. Because the transistors, such as 630 and 632, complement each other, there is no steady state current flow.

As mentioned, the 5 LSBs are processed first. For purposes of clarity, the explanation of how the capacitor array 614 operates is described with reference to only one of the elements (switches 630 and 632 and capacitor 634).

Initially, the upper and lower voltages for the particular range of operation (HIGH or LOW) in which the CAPDAC 610 is operating are applied to signal lines VHI and VLO. Immediately after the previously converted data value is read from the capacitor array, A signal PRE# is asserted to force the gate electrodes of the switch transistors 630 and 632 to ground potential. This couples the lower terminal of capacitor 634 to VHI. While the signal PRE# is asserted, the signal ZERO is asserted, which couples the upper terminal of the capacitor 634 to VHI. When coupled in this manner, all stored charge is removed from the capacitor 634 and the potential VHI exists across the parasitic capacitor 636.

Next, the signal EVAL# is asserted. This signal applies the digital values representing the 5 LSBs to the capacitor array 614, and in particular it applies the signal LSB4, as the signal BIT4, to the gate electrodes of transistors 630 and 632. If LSB4 is logic-low, transistor 630 is conductive and a positive potential ($V_{DD}$) is applied to the gate electrodes. Otherwise, transistor 630 is not conductive and the gate electrodes remain at ground potential. When $V_{DD}$ is applied to the gate electrodes of the transistors 630 and 632, transistor 630 is turned off and transistor 632 is turned on, coupling the reference potential VLO to the lower terminal of capacitor 634 and the upper terminal of transistor 632. When this occurs, the capacitor 634, which has no stored charge, shares charge from the other capacitors, 642, 644, 646 and 648 as well as with a capacitor 616. This sharing of charge reduces the potential 10BOUT, in proportion to the capacitance of the capacitor 634. The capacitances of the capacitors 634, 642, 644, 646 and 648 are in a ratio of 32:16:8:4:2:1. The capacitor 616 has a capacitance that is slightly greater than that of capacitor 648. This capacitor holds an amount of charge substantially equal to 1/32 of the charge on the capacitors 634.

At the end of the LSB portion of the cycle, an amount of charge proportional to the digital value of the 5 LSBs of the digital value has accumulated on the six capacitors. At this instant, the signal XFER is asserted, which turns off transistor 652, removing the VLO reference from the lower terminal of capacitor 616.

Next, the digital values for the 5 MSBs are converted in the same manner as the LSBs, except that capacitor 616 is not affected. This occurs because the capacitor is "floating," its lower terminal is not coupled to VLO. At the end of the MSB portion of the conversion process, both of the signals EVAL# and PRE# are disabled, and the capacitors 616, 634, 642, 644, 646 and 648 are referenced to ground potential through their parasitic capacitances (for capacitors 634, 642, 644, 646 and 648) and through the substrate connection of the channel of transistor 652 for the capacitor 616. In this configuration, capacitor 616 contributes an amount of charge substantially proportional to the LSB portion of the digital value and the other capacitors contribute an amount of charge proportional to the MSB portion of the digital value. This total charge, referenced to ground potential, becomes a voltage, which forms the output signal 10BOUT.

In this embodiment of the invention, each capacitance of the capacitors in the array 614 is scaled in a binary manner to properly weight the contribution of each bit to the analog voltage representation. For example, in FIG. 6, capacitor 648 has a capacitance of 0.4 picofarads (pF); capacitor 646 has a capacitance of 0.8 pF; capacitor 644 has a capacitance of 1.6 pF; capacitor 642 has a capacitance of 3.2 pF; and capacitor 634 has a capacitance of 6.4 pF. Additionally, the storage capacitor 616 on which at least a portion of the 5 LSB subtotal is stored, has a capacitance of slightly greater than 1/32 of the total capacitance in the array 614. This capacitance is slightly greater than 1/32 of the total capacitance of the array to compensate for the parasitic capacitor 618.

Some of the advantages provided by the CAPDAC 224 include that only 4 reference voltages are required to achieve 2×1024 levels when a fixed potential is applied to back plane of the LCD array. For example, the references needed for the high range are 9V and 13.5V; and, the reference voltages needed for the low range are 6V and 1.5 V. It should be noted that for applications where the backplane is appropriately driven, to prevent polarization of the LCD array, one range can suffice for the CAPDAC 610.

Moreover, the capacitor array 614 of CAPDAC 610 draws no steady-state current once the capacitors are charged. Since reference voltage levels are essentially unloaded and settle to precise levels, non-pattern sensitive precision is achieved without the need of exceptionally "stiff" reference voltage power supplies which may otherwise be needed to provide accurate reference voltages under different load conditions.

Furthermore, the total capacitance of all switched capacitors is relatively moderate (10.5 pF/column) allowing settling of all columns after range switching to \0.1% in \0.31s line time. Thus a single set of capacitors can efficiently serve in both the high and low ranges.

All CAPDACs for the 128 columns are loaded simultaneously and, in combination with their respective OPAMP circuits present a precision driven output to the LCD array for approximately 95% of each line time; and a stored-charge output of lesser precision for the remaining 5% time. This is important because as the size of the LCD displays (and, thus, the column capacitance) increase, the availability of nearly 100% of line driving time becomes increasingly important to ensure that the pixel cells have sufficient time to reach their ultimate charge value.

FIG. 7 shows a circuit schematic of an OPAMP 228 of FIG. 2. OPAMP 710 includes 100% feedback, 1.000×gain, and an open loop gain of >4,000. OPAMP 228 accepts a "high impedance", low parasitic, input voltage from CAPDAC 224 and outputs a low impedance drive suitable for driving columns with 150–400 pF column capacitance.

In addition, the "rail-to-rail", class AB, OPAMP 710 efficiently functions with transparent, "background autocalibration" with substantially zero offset over the entire range via the VADJ voltage levels, as the VADJ voltage level is automatically adjusted by a feedback loop described below with reference to FIGS. 7 and 8.

First, as shown in FIG. 7, two CMOS switches are employed between CAPDAC 224 and OPAMP 228. These switches allow CAPDAC 224 to transparently change range (switch 712) while preventing the OPAMP 228 from changing the potential applied to the LCD array (switch 732) during autocalibration.

In particular, the output voltage from CAPDAC 224 is applied to the OPAMP via the terminal IN. Just prior to CAPDAC 224 changing range, the timing of the control signal DAC__IN is such that switch 712 is closed briefly to isolate CAPDAC 224 from OPAMP 228 when the range is changed, so the range change does not affect the levels being driven. During autocalibration, however, switch 714 is closed, responsive to the signal DAC__IN2, during the entire autocalibration interval to prevent the output signals provided by the CAPDAC 224 from affecting the reference voltage being applied to the opamps.

Continuing with FIG. 7, OPAMP 710 includes a complementary differential input stage and an independent nested 2nd stage with a separate "mini" operational amplifier, described below with reference to FIG. 8.

The OPAMP 710 is actually two complementary operational amplifiers arranged in a push-pull configuration. An N-opamp is formed by two N-channel FETs 756 and 758, a current mirror 762 and biasing circuitry 763. A complementary P-opamp is formed by P-channel FETs 752 and 754, a current mirror 760 and biasing circuitry 761. The output signal of the N-opamp is the signal NOUT while the output signal of the P-opamp is the signal POUT. It is this configuration of the circuit as complementary operational amplifiers which allows the circuit shown in FIG. 7 to operate rail-to-rail.

As shown, during normal operation, the input signal IN is applied to both opamps simultaneously. The gate electrodes of transistors 756 and 752 are coupled to the terminal IN via switches 712 and 714. The gate electrodes of the other transistors of each differential pair, 758 and 754, are coupled to the signal MINI which, as described below, is the output signal of the combined differential amplifiers. In this configuration, the combined differential amplifier has a gain of unity.

The output signal, NOUT of the N-opamp is combined with the output signal, POUT of the P-opamp by the gates 766 and 764. These transistors form a first push-pull output stage which generates the signal MINI. A second push-pull output stage formed by transistors 790 and 792 provide additional output drive for the amplifier 710. The output signal of the amplifier is applied to the LCD array via the switch network 732. This network provides the combined output signal of the two push-pull stages when the signal DRIVE# is asserted. The transfer function of a column of the LCD array is represented by the resistor 794 and capacitor 730.

In the exemplary embodiment, the zero point of the OPAMP 710 may be adjusted via the transistors 770 and 772, respectively. The transistor 770 is the output leg of a current mirror which includes transistor 771 as its input leg. In the same way, transistor 772 is the output leg of a current mirror which includes transistor 773 as its input leg. The relative amounts of current which may be drawn by transistor 754, relative to transistor 752 and by transistor 756, relative to transistor 758 are determined by the current that is provided by transistors 770 and 772, respectively. This current, in turn, is determined by the combination of transistors 740 and 741. As the control potential VADJ becomes more positive, the resistance of transistor 740 decreases to a minimum value determined by transistor 741. As this resistance decreases, the amount of current provided by transistors 770 and 772 increases, changing the balance point of the OPAMP 710. The signal VADJ is provided by a mini operational amplifier, described below with reference to FIG. 8.

The autocalibration circuitry of the amplifier 710 operates as follows. At some point in each horizontal line time, switches 714 and 732 are disabled, isolating the amplifier 710 from the CAPDAC 610 and the LCD array. Shortly thereafter, switches 746 and 782 are made conductive by asserting the signals V6_ON# and COL_STR. This combination allows capacitor 781 to charge to a potential substantially equal to VHI. In the exemplary embodiment of the invention, autocalibration always occurs when VHI is equal to 6 v. Next, switch 746 is turned off and switch 780 is turned on. This applies VHI, as stored on capacitor 781, to both input terminals of the OPAMP 710. If there is any imbalance in the OPAMP 710, the output signal MINI will be greater than or less than 6 v. If the amplifier is balanced, the output signal will be substantially equal to 6 v. The signal MINI is applied to the mini-opamp, shown in FIG. 8, to generate the control signal VADJ for the OPAMP 710.

FIG. 8 shows the mini-opamp autocalibration circuit 810 which forms a part of the autocalibration circuit 226. As described above, the mini-opamp 810 is coupled between the output and input terminals of the OPAMP 710 while the output drive stage to the column capacitance is switched off. This circuitry allows transparent autocalibration in minimal time, and reduces charge injection between OPAMP output and OPAMP input from the capacitor array and thus improves settling time because the mini opamp is isolated from the high column capacitance (160–400 pF) at the outputs.

The mini-opamp 810 includes a conventional differential amplifier 814, composed of a differential pair, 810, current mirror 814 and biasing circuit 812. The input terminals of the differential pair 810 are both coupled to receive the reference potential (e.g. 6 v) during the logic-low portion of each pulse of the signal CLK and to receive the signal REF and the signal MINI, respectively, during the logic-high portion of each pulse of the signal CLK. The output signal of the mini-opamp is coupled, via capacitor 830 to an autozeroed comparator 820.

The comparator 820 includes an inverter, formed by transistors 821 and 823 and a transmission gate 822. Responsive to a gating signal X0, the transmission gate 822 closes, bringing the input terminal and output terminal of the inverter to the same potential. As soon as X0 becomes logic-zero (i.e. just before a negative-going transition of the signal CLK), the inverter senses the signal, representing an amplified imbalance potential, on the capacitor 830 and switches its output signal to be either logic-high or logic-low. This output signal is $V_{DD}$ if REF is greater than MINI and ground otherwise.

Next, responsive to a gating signal X1, a parasitic capacitance, represented by the junction of transistors 824 and 826, charges to the potential provided by the transistors 821 and 823. After X1 has switched transistor 824 off, a gating signal X2, switches transistor 826 on, transferring a the charge on the parasitic capacitance to the capacitor 850. This capacitor slowly accumulates charge until the proper value for VADJ is reached to produced a balanced output from the OPAMP 710.

Autocalibration is an important aspect of the invention since the distribution of CMOS opamp offsets in a group of 128 buffers without autocalibration can be as high as 15 mv (equivalent to approximately 3 LSBs which is detectable by the human eye). In the exemplary embodiment of the invention, background autobalancing of each of the 128 OPAMPs near mid-scale can reduce the distribution to about 1 mv or less.

It should be noted, as understood by those skilled in the art, that the bias signals for the circuitry in FIGS. 7 and 8 (NBIAS/PBIAS and NBIAS_1/NBIAS_2) are generated by the respective circuits shown in the respective FIGS. 7a and 8a.

FIG. 9 shows an exemplary layout of an integrated circuit (IC) containing the column driver shown in FIG. 2. The wiring connections between the IC and the LCD (not shown) are such that all 128 column driver outputs are desirably located on only one side of the IC. Also, as mentioned above, the IC outputs are desirably actively driven 95% of the time, since "floating" columns in a noisy switching environment can store unacceptably large, random, noise voltage variations, on any pixel that is not fully switched OFF.

The ability of the invention to generate small incremental voltage steps allows straightforward digital gamma correction, for example, using an EPROM lookup table to remap 8-bit digital inputs into a 10-bit field to allow uniform brightness steps. As mentioned, the digital design of the invention makes it especially compatible with digital gamma correction applications for factors which can significantly affect the quality of the LCD such as temperature and age.

FIG. 10 shows a high-level functional block diagram of the column driver 210 of the invention operating in conjunction with a gamma correction circuit 1010, which handles both temperature and age input data, to properly drive the LCD 1012. In particular, because temperature and age are factors which can significantly affect the voltage ranges used for determining proper gray scale levels for a cell, the arrangement shown in FIG. 10 includes a temperature sensor 1014 positioned proximate to the LCD display for generating accurate temperature readings. The analog temperature readings are converted into digital form by analog-to-digital converter 1016 and applied to the digital gamma correction unit 1010. The arrangement of FIG. 10 also includes an digital age input which allows gamma correction unit 1010 to correct for any undesirable range shifts due to the age of the LCD circuitry. An age signal may be obtained, for example from the four MSBs of a continuously running clock. Ideally, these bits represent units of time on the order of months and years.

The gamma correction circuitry 1010 converts the 8-bit pixel value signal, 4-bit temperature value and 4-bit age value into corresponding digital values which will be processed by the column drive circuitry 1018 to produce analog values that provide a gray scale illumination that is consistent with the 8-bit digital value. This gray scale illumination is a function of the gamma of the display as modified by its temperature and age.

It should be noted that the CMOS technology used to implement the circuit design is widely available and well known in the semiconductor industry. The specific process in which the original circuit design is implemented is the Harris Semiconductor Corp., BiCMOS2E process.

Although illustrated and described herein with reference to certain specific embodiments, the invention is nevertheless not intended to be limited to the details shown. Rather, various modifications may be made in the details within the scope and range of equivalents of the claims and without departing from the spirit of the invention. In particular, while the invention has been described in terms of its implementation in a liquid crystal display, it can equally well be used in other types of displays requiring column drivers such as electroluminescent displays where its advantages enhance the display performance.

I claim:

1. A column driver circuit for producing drive signals for a plurality of columns of a display which displays lines of picture elements during respective line intervals, the column driver circuit comprising:

register means having a plurality of storage cells which hold digital values corresponding to a respective plurality of picture elements in the display;

switched-capacitor digital-m-analog converter means coupled to respective ones of the plurality of storage cells, which generate analog signal levels representing the digital values, respectively, wherein the switched capacitor digital-to-analog converter means includes a capacitor array means which separately processes a group of least significant bits of the digital values and then a group of most significant bits of the digital values; and driver amplifier means, responsive to the analog signal levels, which produce signals to drive the respective plurality of columns of the display during an interval greater than one-half of the line time, wherein the driver amplifier means further includes means for auto-calibrating the driver amplifier means.

2. The apparatus of claim 1, wherein the display is a liquid crystal display.

3. The circuit of claim 2, wherein the switched capacitor digital-to-analog converter means operates in at least two voltages ranges, further including switch means, operatively located between the switched capacitor digital-to-analog converter means and the driver amplifier means, for allowing the switched capacitor digital-to-analog converter means to switch voltages ranges without affecting the output of the driver amplifier means.

4. The circuit of claim 1, wherein the switched capacitor digital-to-analog converter means further includes a storage capacitor means for holding an analog voltage representative of the group of least significant bits of the digital value until the processing of the most significant bits is completed.

5. The circuit of claim 4, wherein the switched capacitor digital-to-analog converter means operates in at least two voltages ranges, further including switch means, operatively located between the switched capacitor digital-to-analog converter means and the driver amplifier means, for allowing the switched capacitor digital-to-analog converter means to switch voltages ranges without affecting the output of the driver amplifier means.

6. The circuit of claim 1, wherein the switched capacitor digital-to-analog converter means operates in at least two voltages ranges, further including switch means, operatively located between the switched capacitor digital-to-analog converter means and the driver amplifier means, for allowing the switched capacitor digital-to-analog converter means to switch voltages ranges without affecting the output of the driver amplifier means.

7. The circuit of claim 1, wherein the most significant bits are processed separately and subsequently with respect to the processing of the least significant bits.

8. A display apparatus comprising:

a liquid crystal display (LCD) which display lines of picture elements during respective line intervals;

a column driver circuit for producing drive signals for a plurality of columns of the liquid crystal display, the column driver circuit including:

register means having a plurality of storage cells which hold digital values corresponding to a respective plurality of picture elements in the liquid crystal display;

switched-capacitor digital-to-analog converter means, coupled to respective ones of the plurality of storage cells, which generate analog signal levels representing the digital values, respectively, wherein the switched capacitor digital-to-analog converter means includes a capacitor array means which separately processes a group of least significant bits of the digital values and then a group of most significant bits of the digital values; and driver amplifier means, responsive to the analog signal levels, which produce signals to drive the respective plurality of columns of the liquid crystal display during an interval greater than one-half of the line time;

temperature sensing means for sensing the temperature of the LCD and producing digital values corresponding thereto;

means for indicating an age of the LCD in digital form;

gamma correction means, responsive to the temperature sensing means and means for indicating age, for providing a gamma corrected digital input to the column driver circuit.

9. The apparatus of claim 8, wherein the switched capacitor digital-to-analog converter means further includes a storage capacitor means for holding an analog voltage representative of the group of least significant bits of the digital value until the processing of the most significant bits is completed.

10. The apparatus of claim 9, wherein the switched capacitor digital-to-analog converter means operates in at least two voltages ranges, further including switch means, operatively located between the switched capacitor digital-to-analog converter means and the driver amplifier means, for allowing the switched capacitor digital-to-analog converter means to switch voltages ranges without affecting the output of the driver amplifier means.

11. The apparatus of claim 8, wherein the switched capacitor digital-to-analog converter means operates in at least two voltages ranges, further including switch means, operatively located between the switched capacitor digital-to-analog converter means and the driver amplifier means, for allowing the switched capacitor digital-to-analog converter means to switch voltages ranges without affecting the output of the driver amplifier means.

12. The apparatus of claim 8, wherein the driver amplifier means further includes means for autocalibrating the driver amplifier means.

13. The apparatus of claim 12, wherein the switched capacitor digital-to-analog converter means operates in at least two voltages ranges, further including switch means, operatively located between the switched capacitor digital-to-analog converter means and the driver amplifier means, for allowing the switched capacitor digital-to-analog converter means to switch voltages ranges without affecting the output of the driver amplifier means.

14. The apparatus of claim 8, wherein the register means further includes a means for performing polarity inversion on the stored digital values.

15. The apparatus of claim 8, wherein the driver amplifier means produces signals to drive the respective plurality of columns of the liquid crystal display during an interval greater than 90% of the line time.

16. The apparatus of claim 8, wherein the most significant bits are processed separately and subsequently with respect to the processing of the least significant bits.

17. An autocalibrated driver amplifier circuit for driving a column of a display during an interval greater than one-half of a data/column line time comprising:

driver amplifier means, responsive to a plurality of analog signal levels, to produce signals to drive the column of the liquid crystal display during an interval greater than one-half of the data/column line time, wherein the driver amplifier means includes a P-differential and an N-differential stage pair with respective current mirror circuits;

a common current string coupled to the respective mirror circuits; and means for autocalibrating the driver amplifier means by identically mirroring balancing currents into opposite legs of the P-differential and N-differential stage pair from the common current string.

18. The apparatus of claim 17, wherein the display is a liquid crystal display.

* * * * *